(12) United States Patent
Wang

(10) Patent No.: US 7,340,702 B2
(45) Date of Patent: Mar. 4, 2008

(54) METHOD AND APPARATUS FOR INDUCTION PROOF

(75) Inventor: Bow-Yaw Wang, Nankang (TW)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/626,475

(22) Filed: Jul. 23, 2003

(65) Prior Publication Data

US 2005/0022144 A1    Jan. 27, 2005

(51) Int. Cl.
*G06F 17/50* (2006.01)
(52) U.S. Cl. .................. 716/5; 716/3; 716/4; 716/6; 716/7
(58) Field of Classification Search .............. 716/3, 716/5, 7; 703/2; 707/101; 717/100, 136
See application file for complete search history.

(56) References Cited

U.S. PATENT DOCUMENTS

| | | | | |
|---|---|---|---|---|
| 5,331,568 | A * | 7/1994 | Pixley | 716/3 |
| 6,163,876 | A * | 12/2000 | Ashar et al. | 716/5 |
| 6,484,134 | B1 * | 11/2002 | Hoskote | 703/14 |
| 6,745,160 | B1 * | 6/2004 | Ashar et al. | 703/14 |
| 2002/0178424 | A1 * | 11/2002 | Gupta et al. | 716/5 |
| 2004/0153308 | A1 * | 8/2004 | McMillan et al. | 704/5 |
| 2004/0230407 | A1 * | 11/2004 | Gupta et al. | 703/2 |

OTHER PUBLICATIONS

Sheeran et al., "Checking Safety Properties Using Induction and a SAT-Solver", Nov. 2000, In Proc. Conference on Formal Methods in Computer-Aided Design.*

Wedler et al., "Using RTL statespace information and state encoding for induction based property checking", 2003, Design, Automation and Test in Europe Conference and Exhibition, pp. 1156-1157.*

Wedler et al., "Exploiting state encoding for invariant generation in induction-based property checking", Jan. 27-30, 2004, Desi Automation Conference, 2004. Proceedings of the ASP-DAC 2004. Asia and South Pacific, pp. 424-429.*

Shende et al., "Synthesis of reversible logic circuits", Jun. 2003, Computer-Aided Design of Integrated Circuits and Systems, IEEE Transactions on, vol. 22, Issue: 6, pp. 710-722.*

Prakash et al., "A high-performance architecture and BDD-based synthesis methodology for packet classification", Jun. 2003, Computer-Aided Design of Integrated Circuits and Systems, IEEE Transactions on, vol. 22, Issue: 6, pp. 698-709.*

(Continued)

*Primary Examiner*—Jack Chiang
*Assistant Examiner*—Helen Rossoshek
(74) *Attorney, Agent, or Firm*—Bingham McCutchen LLP

(57) ABSTRACT

Inductive proof can be an improvement to bounded verification. Forward and backward inductive proof methods are disclosed, which can improve the process of verifying properties of circuit designs. An inductive set of one or more states includes passing a first property of a circuit design. State of the inductive set passing at least the first property of the circuit design are transitioning by at least one step in a forward direction, resulting in transitioned states. It is determined if the transitioned states of the inductive set pass at least the first property of the circuit design. At least the transitioning and the determining are repeated, until at least, the determining results in the transitioned states of the inductive set passing at least the first property of the circuit design.

30 Claims, 4 Drawing Sheets

OTHER PUBLICATIONS

Parthasarathy et al., "Safety property verification using sequential SAT and bounded model checking", Mar.-Apr. 2004, Design & Test of Computers, IEEE, vol. 21, Issue 2, pp. 132-143.*

De Moura et al., "Bounded model checking and induction: from refutation to verification", 2003, In: Proceedings of Computer-aided verification, CAV, pp. 14-26.*

Awedh et al., "Proving more properties with bounded model checking", 2004, 16th International Conference, CAV 2004, vol. 3114, pp. 96-108.*

International Search Report and Written Opinion for PCT/US03/23637 dated May 16, 2005.

International Search Report and Written Opinion for PCT/US04/23637 dated May 16, 2005.

* cited by examiner

METHOD AND APPARATUS FOR INDUCTION PROOF

BACKGROUND OF THE INVENTION

Verification is typically the most time-consuming component in a circuit design process. Failing to detect functional design errors early in the design stages usually leads to expensive re-spin of the designs. This re-spin includes diagnosis and correction of the errors, logic and physical re-synthesis, and even re-manufacturing of the chips that can be very time-consuming, costly and delay the time-to-market of a product. If the chip designs are already used in some released products, this can even lead to product recalls that are very devastating to a company.

Property checking is an approach for verifying the functionality of a circuit design. It involves proving one or more properties specified for a circuit design. A property, which can also be called an assertion, may be logical (e.g., Boolean) and/or temporal, and describes behavior of one or more signals in the circuit design.

Formal verification of a property verifies that the property holds for all combinations of input signals and sequences over time. For example, to verify that a property holds, formal verification tools or methods attempt to check all states possible during operation of the circuit design, where the operation starts from one or more initial states of the circuit design. Successfully checking all the states ensures that the property is not violated. During the state space search, if a contradiction is found, the property is disproved and a counterexample can usually be generated to demonstrate how the violation occurs.

Formal verification is therefore very useful for uncovering corner-case bugs because it determines whether or not a property is true in the circuit design by exercising all possible behavior of the circuit design. However, due to the exceedingly large and complex circuits that are being designed today, formal verification is subject to the classical state explosion problem. For example, a typical circuit design may contain hundreds of thousands of state variables (state-holding elements, i.e. flip flops), where each state variable may have one of two values, either 0 or 1. The number of possible value combinations (or states) checked by formal verification techniques is extremely large, and some states can only be reached after a very large number of transitions. It is therefore very difficult to perform state space search exhaustively for large designs. Such complexity presents memory and time constraints that make formal verification for large, but typical, circuit designs intractable.

Bounded verification, determines whether or not a property is true in the circuit design for a specific number of transitions. In contrast to the exhaustive search associated with unbounded verification, bounded verification checks the behavior exhaustively for a limited number of transitions. Its main benefit is that the limitation on the number of transitions usually greatly reduces the complexity of the verification problem. However, bounded verification fails to check the behavior beyond the limited number of transitions.

It would be desirable to combine the benefits of limiting the number of transitions checked and yet gain some assurance on the thoroughness of property checking beyond just bounded verification.

BRIEF SUMMARY OF THE INVENTION

One embodiment includes in an inductive set of one or more states a plurality of states of a circuit design. The inductive set of one or more states includes at least states passing a first property of the circuit design. States of the inductive set passing at least the first property of the circuit design are transitioning by at least one step in a forward direction, resulting in transitioned states. It is determined if the transitioned states of the inductive set pass at least the first property of the circuit design. At least the transitioning and the determining are repeated, until at least, the determining results in the transitioned states of the inductive set passing at least the first property of the circuit design.

Another embodiment transitions by at least one step, in a backward direction, states of an inductive set of at least one or more states of a circuit design passing at least a first property of the circuit design, resulting in transitioned states. It is determined if the transitioned states of the inductive set fail at least the first property of the circuit design. The transitioning and the determining are repeated, until at least, the determining results in the transitioned states of the inductive set failing at least the first property of the circuit design.

Another embodiment attempts bounded verification of one or more properties of a circuit design for at least a first number of transitions. Induction proof of the one or more properties of the circuit design for at least the first number of transitions is attempted. It is determined if the one or more properties of the circuit design are verified, based at least on the bounded verification and the induction proof.

Another embodiment includes a first iteration of transitioning by at least one step, in a backward direction, states of a first iteration of an inductive set of at least one or more states failing at least a first property of a circuit design, resulting in a first iteration of transitioned states. It is determined in a first iteration if the first iteration of transitioned states of the inductive set fail at least the first property of the circuit design.

DETAILED DESCRIPTION OF THE INVENTION

Figure 1:
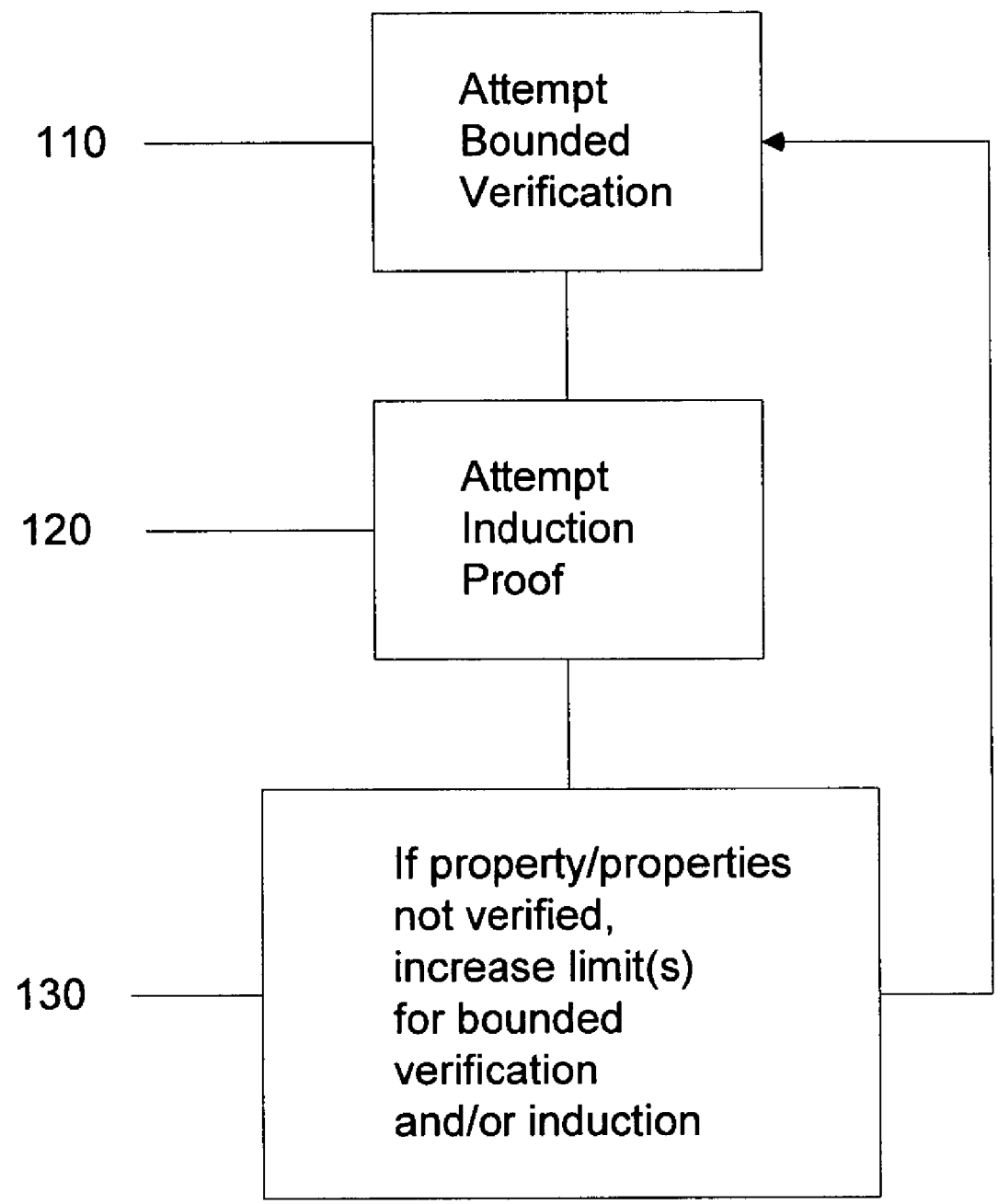
FIG. 1 shows an example of verification with both bounded verification and inductive proof.

FIG. 1 shows an example of circuit verification attempting induction proof. In 110, bounded verification is attempted, of the property/properties of a circuit design, for a number of transitions. In 120, induction proof is attempted of the property/properties of the circuit design for the number of transitions. In 130, it is determined if the property/properties of the circuit design is/are verified, based on the bounded verification and the induction proof, and if the property/properties is/are not verified, a limit/limits are increased for the bounded verification and/or the induction proof, and at least part of the algorithm is repeated. The shown algorithm is illustrative, and parts can be added, removed, rearranged, and/or modified. For example, the induction proof can be attempted prior to, after, or while the bounded verification is being attempted, or some combination thereof.

Figure 2:
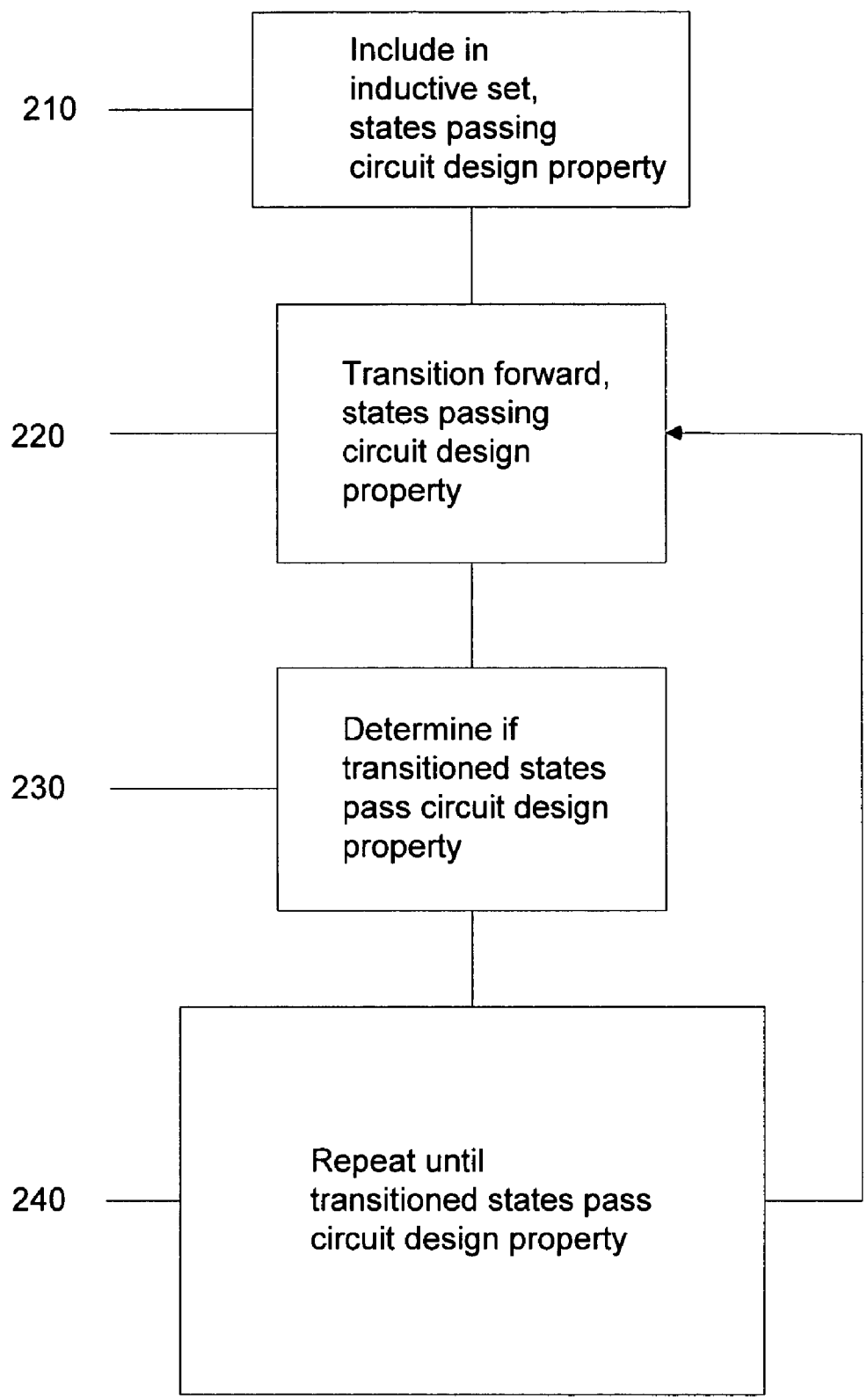
FIG. 2 shows an example of forward inductive proof.

FIG. 2 shows an example of attempting induction proof in the forward direction. In 210, at least states passing one or more circuit design properties are included in an inductive set. In 220, states passing one or more circuit design properties are transitioned forward, by one or more transitions. This results in transitioned states. In 230, it is determined whether transitioned states pass one or more circuit design properties. In 240, the algorithm is repeated (for example, 220 and/or 230) until, at least, transitioned states pass one or more circuit design properties. The shown algorithm is illustrative, and parts can be added, removed, rearranged, and/or modified.

Many varying embodiments of FIG. 2 can be practiced. For example, in 230 determining whether transitioned states pass one or more circuit design properties, may not consider transitioned states resulting from transitioning of states of the inductive set failing one or more properties of the circuit design. In 230, determining whether transitioned states pass one or more circuit design properties can consider only transitioned states resulting from transitioning of states of the inductive set passing one or more properties of the circuit design.

In another embodiment, in 220, transitioning states forward may not be performed on states of the inductive set failing one or more properties of the circuit design. Also, in 220, transitioning states forward may be performed only on states of the inductive set passing one or more properties of the circuit design.

Various embodiments can differ as to what states are included in the inductive set, prior to each time 220 and/or 230 is repeated. For example, the inductive set can include transitioned states. The inductive set can include transitioned states passing one or more properties of the circuit design. The inductive set can exclude transitioned states failing one or more properties of the circuit design.

The algorithm of FIG. 2 can be repeated, until all transitioned states of the inductive set are determined to pass the one or more properties of the circuit design. These transitioned states of the inductive set are transitioned by a total number of transitions. In combination with this inductive proof, bounded verification is performed. In a forward direction, initial states of the circuit design are transitioned by at least the total number of transitions, resulting in a forward transitioned set of states. If the forward transitioned set of states passes the one or more properties of the circuit design, then this bounded verification, combined with the inductive proof, is sufficient to determine the circuit design to be formally verified for the one or more properties of the circuit design.

Figure 3:
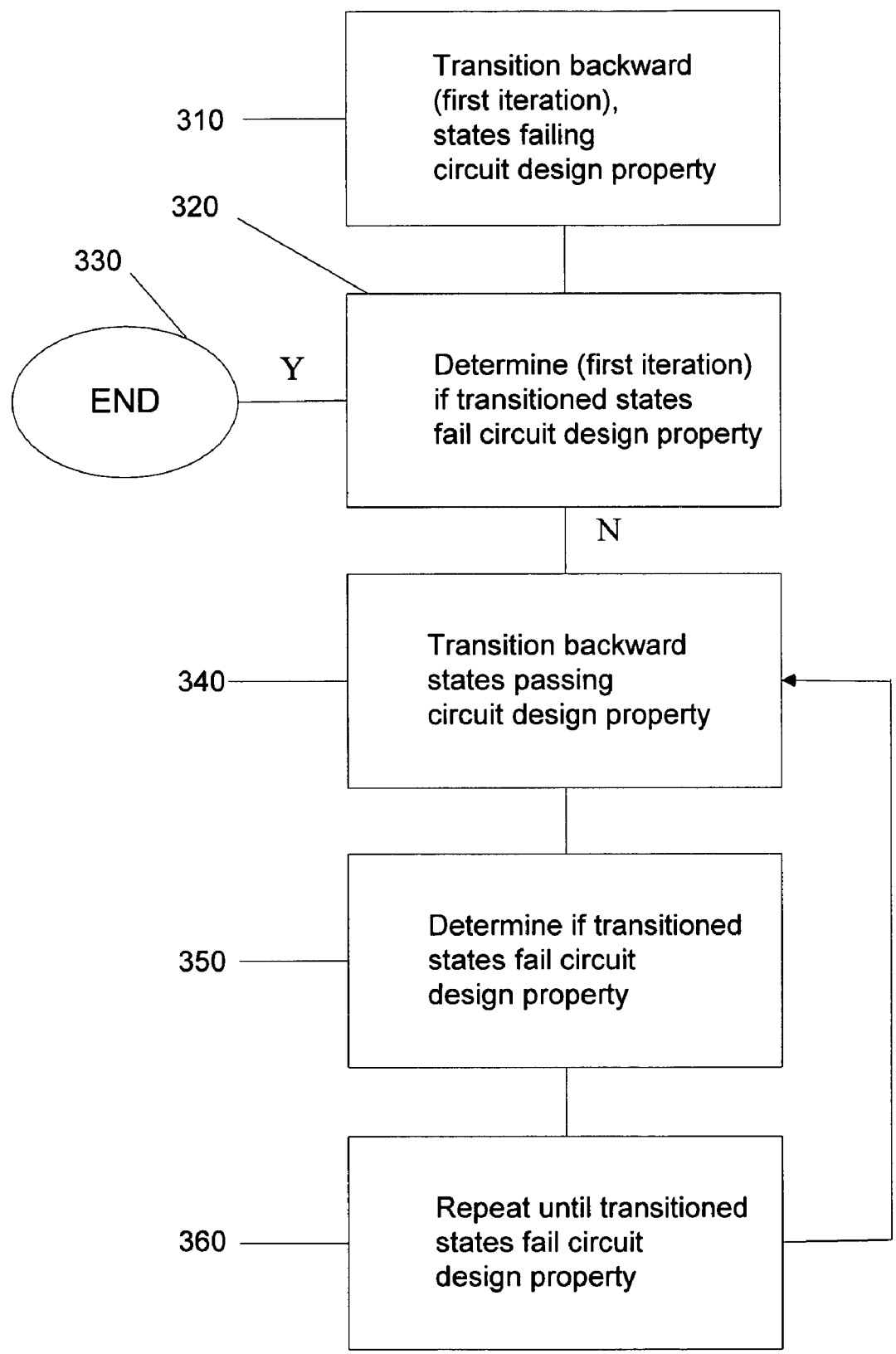
FIG. 3 shows an example of backward inductive proof.

FIG. 3 shows an example of attempting induction proof in the backward direction. In 310, for a first iteration, at least states failing one or more circuit design properties are transitioned backward. This results in a first iteration of transitioned states. First iteration can refer to a very first iteration, or an early iteration. In 320, it is determined for a first iteration if the first iteration of transitioned states fail one or more circuit design properties. If so, the algorithm can end 330. If not, the algorithm proceeds to 340. In 340, at least states passing one or more circuit design properties are transitioned backwards. This results in transitioned states. In 350, it is determined if transitioned states fail one or more circuit design properties. In 360, if transitioned states pass one or more circuit design properties, part of the algorithm is repeated (such as 340 and/or 350) until, at least, transitioned states fail one or more properties of the circuit design. The shown algorithm is illustrative, and parts can be added, removed, rearranged, and/or modified.

Various embodiments can differ, at some point after 310, as to what states are included in the inductive set, prior to each time 340 is repeated. For example, the inductive set can include transitioned states. The inductive set can include transitioned states passing one or more properties of the circuit design. The inductive set can exclude transitioned states failing one or more properties of the circuit design. The inductive set can exclude transitioned states able to reach, in one forward transition, any state of the circuit design failing one or more properties of the circuit design. The inductive set can include transitioned states except for transitioned states able to reach, in one forward transition, any state of the circuit design failing one or more properties of the circuit design. The inductive set can include transitioned states passing one or more properties of the circuit design except for transitioned states able to reach, in one forward transition, any state of the circuit design failing one or more properties of the circuit design. The inductive set can exclude transitioned states failing one or more properties of the circuit design and transitioned states able to reach, in one forward transition, any state of the circuit design failing one or more properties of the circuit design.

Various embodiments can differ as to what states are considered in 350 when determining if transitioned states fail one or more circuit design properties. For example, the determining process in 350 may not consider transitioned states resulting from transitioning of states of the inductive set failing one or more properties of the circuit design. The determining process in 350 may consider only transitioned states resulting from transitioning of states of the inductive set passing one or more properties of the circuit design.

Various embodiments can differ as to what states are transitioned in 340. For example, the process of transitioning may not be performed on states of the inductive set failing one or more properties of the circuit design. The process of transitioning may be performed only on states of the inductive set passing one or more properties of the circuit design.

Various embodiments can differ as to what states are included in the inductive set after the first transitioning occurs in 310 and before the subsequent transitioning of 340 occurs. The inductive set can include the first iteration of transitioned states. The inductive set can include the first iteration of transitioned states passing one or more properties of the circuit design. The inductive set can exclude the first iteration of transitioned states failing one or more properties of the circuit design.

The following discusses unbounded verification, followed by bounded verification.

Let M be a circuit design and $\phi$ a property. It is checked whether M satisfies $\phi$. Representing the transition relation of M where S is the state space of M, uses $T_M \subseteq S \times S$. All states satisfying $\phi$ are denoted as $[\phi]$. Let $S_0 \subseteq S$ be the initial states of M. An exemplary BDD-based forward search algorithm is shown in example 1. Starting from the initial states $S_0$, the forward search algorithm first checks that all of these states satisfy $\phi$. If not, false is reported. Otherwise all reached states R is updated, all states which are reachable from D within one step computed, and newly reached states considered in the next iteration. If no new state can be found, the algorithm reports true.

```
R = ∅
D = S₀
while D ≠ ∅
        if D ∩ [¬φ] ≠ ∅
        then
                return false
        else
```

-continued

```
        R = R ∪ D
        D = T_M (D)
        D = D\R
return true
```

EXAMPLE 1

Exemplary BDD-based Forward Search Algorithm

Similarly, one can check a property by backward search. Example 2 shows an exemplary backward search algorithm. The backward search algorithm starts from all states which do not satisfy $\phi$. It is first checked whether any initial states belong to $[\neg\phi]$. If so, false is reported. Otherwise the reached states R is updated, the states which can reach bad states within one step computed, and newly reached states considered. If no new state can be found, true is reported.

```
R = ∅
D = [¬φ]
while D ≠ ∅
    if D ∩ S_0 ≠ ∅
        then
            return false
        else
            R = R ∪ D
            D = T_M^{-1} (D)
            D = D\R
return true
```

EXAMPLE 2

Exemplary BDD-based Backward Search Algorithm

The preceding examples discussing unbounded verification can be modified to perform bounded verification. The forward search algorithm can essentially compute all reachable states from $S_0$. If none of them violates $\phi$, true is reported. The backward search algorithm can essentially compute all states which can violate $\phi$. If none of the initial states can violate $\phi$, true is reported. Instead of considering all reachable states or all "bad" states, bounded verification, such as a bounded model checker, only checks whether $\phi$ is violated within a given bounded number of transitions (also called limit or a total of steps or a number of steps). A bounded model checker alone does not prove the property. Rather, it proves the property is true (or false) within the given number of transitions. If a design passes bounded model checking alone, it can only be said that there is no violation with traces shorter than or equal to the given bounded number of transitions (also called limit or a total of steps or a number of steps).

With bounded model checking, it is known that the design does not have any counterexample with a length shorter than or equal to the bounded number of transitions (also called limit or a total of steps or a number of steps). Inductive proof can that prove any counterexample with length longer than the given bounded number of transitions (also called limit or a total of steps or a number of steps) does not exist.

One example of forward inductive proof can be the following. Consider the algorithm shown in example 3. D is an example of an inductive set of one or more states. The algorithm starts with the entire state space. The algorithm checks whether the current set of states satisfy $\phi$. If so, the algorithm terminates and reports true. Otherwise, the algorithm finds the subset which satisfies $\phi$, and then computes the successors of the subset.

If the algorithm in example 3 terminates within l iterations, then there is no counterexample with length greater or equal to l. Consider the shortest one among such traces $s_0 \to \ldots \to s_n \to s_{n+1} \to \ldots \to s_{n+l}$ where $s_j \in [\phi]$ for $0 \leq j < n+l$ but $s_{n+l} \in [\neg\phi]$. Let $D_0 = S$ and $D_i$ the value of D at the end of i-th iteration. Consider the following algorithm is one example of forward inductive proof:

```
D = S
while D ⊈ [φ]
    D = D ∩ [φ]
    D = T_M (D)
return true
```

EXAMPLE 3

A BDD-based Forward Induction Algorithm $$D_0 \quad D_1 \quad \cdots \quad D_l$$
$$s_n \quad s_{n+1} \quad \cdots \quad s_{n+l}$$

Since $D_0 = S$, $s_n \in D_0$. For each $0 < i \leq l$, $s_{n+i-1} \in D_{i-1}$ by induction. But $s_{n+1} \in T_M(s_n)$. Hence $s_{n+1} \in D_i = T_M(D_{i-1})$. We have $s_{n+1} \in D_i$ for $0 \leq i \leq l$. But it cannot be because $D_l \subseteq [\phi]$ while $s_{n+l} \in [\neg\phi]$. A contradiction.

The inductive step can be embedded in the loop of the forward search algorithm. First, it can be checked if there is a counterexample of length l. If so, false is reported. Otherwise, it is checked if $D_l$ s a subset of $[\phi]$. If so, true is reported. Otherwise, next iteration continues.

For backward inductive proof, the task remains proving that there is no counterexample of length greater than or equal to the given bounded number of transitions (also called limit or a total of steps or a number of steps). The following algorithm is one example of backward inductive proof. D is an example of an inductive set of one or more states:

```
firsttime = true
D = [¬φ]
do
    D = T_M^{-1} (D)
    if D ⊆ [¬φ] then return true
    D = D ∩ [φ]
while true
```

If the previous algorithm terminates within l iterations, there is no counterexample of length greater than or equal to l. Suppose $s_0 \to \ldots \to s_n \to s_{n+1} \to \ldots \to s_{n+l}$ is the shortest counterexample where $s_j \in [\phi]$ for $0 \leq j < n+l$ but $s_{n+l} \in [\neg\phi]$. Let $D_0 = [\neg\phi]$ and $D_i$ the value of D at the end of i-th iteration. Consider the following diagram:

$$D_0 \quad D_1 \quad \cdots \quad D_l$$

$$s_n \quad s_{n+1} \quad \cdots \quad s_{n+l}$$

Since $D_i = [\neg \phi]$, $s_{n+i} \in D_i$. For $0 < i \leq n$, $s_{n+l-i-1} \in D_{l-i+1}$ by induction hypothesis. But $s_{n+l-i} \in T_M^{-1}(s_{n+l-i+1})$. Hence $s_{n+l-i} \in D_{l-i} = T_M^{-1}(D_{l-i+1})$. Therefore $s_{n+i} \in D_i$ for $0 \leq i \leq l$. But it cannot be, because $s_n \in [\phi]$ while $D_l \subseteq [\neg \phi]$. A contradiction.

The following is another example of backward inductive proof. D is an example of an inductive set of one or more states.

```
firsttime = true
D = [¬φ]
do
    if firsttime
    then
        E = D
        D = T_M^-1 (E)
        firsttime = false
    else
        E = D ∩ [φ]
        Ê = D ∩ [¬φ]
        D = T_M^-1 (E) ∩ (S \ T_M^-1 (Ê))
    if D ⊆ [¬φ] then return true
while true
```

EXAMPLE 4

A BDD-based Backward Induction Algorithm

In both proofs, it is show that the final fragment of the shortest counterexample is contained in the D-sequence. With other properties to prune the D-sequence further while maintaining the containment relation, the proof can still go through and the algorithm has better chance to terminate.

The shortest counterexample is under consideration. It means that $s_i$ can only reach $[\phi]$ within one step for $0 \leq i \leq l-1$. Example 4 shows an example of an algorithm which takes the additional property into consideration.

In example 4, the set D is divided into two parts: those satisfying $\phi(E)$, and those satisfying $\neg \phi(\hat{E})$. From the second iteration onward, it computes the set of states which can reach E in one step ($T_M^{-1}(E)$) and the set of states which cannot reach $\hat{E}$ in one step ($S \backslash T_M^{-1}(\hat{E})$). Consider any shortest trace. Except the last two states, all states in the trace must reach a state satisfying $\phi$ but cannot reach any state violating $\phi$ within one step. The previous proof is still valid in the current setting.

Figure 4:
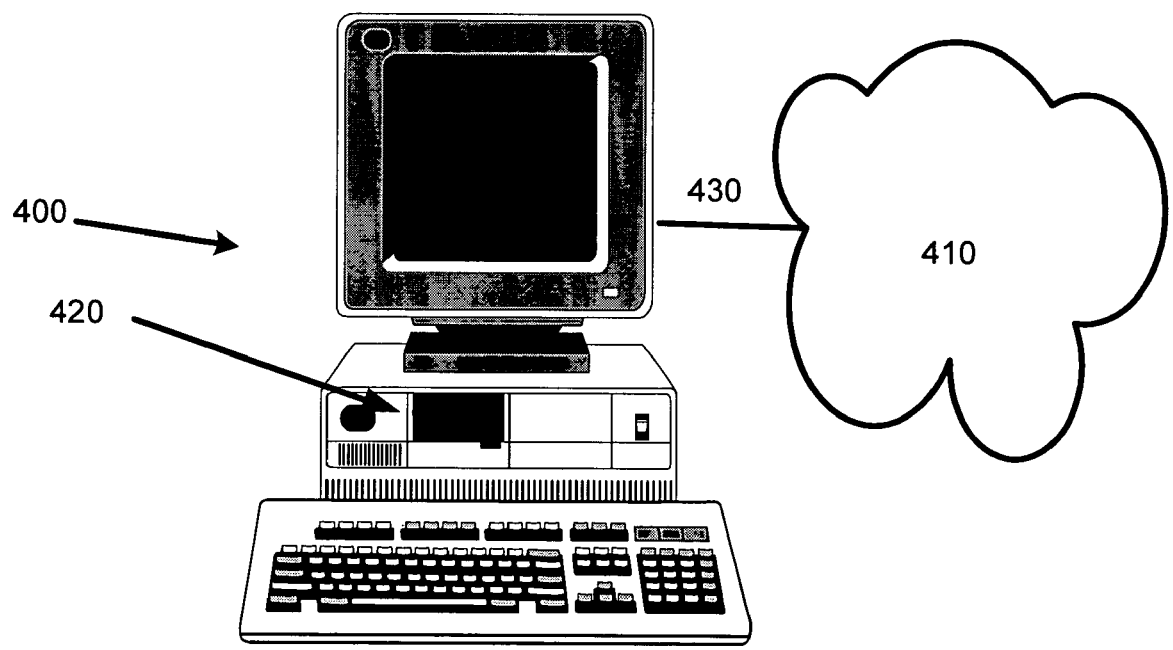
FIG. 4 shows an example of a computer capable of executing inductive proof.

FIG. 4 shows an example of a computer 400 that can execute a inductive proof, which can be code 420. The computer 400 can be connected to a network 410. The computer 400 can execute code 420 with instructions to execute the proof flow. The computer 400 can have the code 420 preinstalled. The computer 400 can receive the code 420 over the network 410, which can be connected to the computer via a link 430, which can be a wireless and/or wired link. The code 400 can be in a temporary state (e.g., electrical, magnetic, and/or optical signal) and/or at least partly hardware, such as in a relatively permanent state (e.g., optical disk, magnetic disk, hard disk, temporary memory such as RAM, flash memory, processor). The computer 400 can have the code 420 installed via such a temporary and/or relatively permanent state hardware. Multiprocessor, multicomputer, and/or multithread implementations can be practiced.

What is claimed is:

1. A method of circuit verification, comprising:
    (a) performing bounded verification on a circuit design for a number of transitions, the bounded verification corresponding to a predetermined limit for a number of transitions, wherein the predetermined limit is less than a total number of all reachable states;
    (b) performing induction proof of a first property for the number of transitions, wherein the induction proof is performed by a process comprising the acts of:
        including, in an inductive set of one or more states, a plurality of states of the circuit design, wherein the inductive set of one or more states includes at least states passing the first property of the circuit design;
        transitioning by at least one step, in a forward direction, states of the inductive set passing at least the first property of the circuit design, resulting in transitioned states;
        determining if the transitioned states of the inductive set pass at least the first property of the circuit design;
        repeating at least the transitioning and the determining, until at least, the determining results in the transitioned states of the inductive set passing or failing at least the first property of the circuit design; and
    (c) if the at least one property is not verified, then increasing the limit for the bounded verification and repeating from (a).

2. The method of claim 1, wherein, if all the transitioned states of the inductive set are determined to pass at least the first property of the circuit design, all the transitioned states of the inductive set determined to pass at least the first property of the circuit design were transitioned by a first total of transitions.

3. The method of claim 2, further comprising:
    transitioning, in a forward direction, initial states of the circuit design by at least the first total of transitions, resulting in a forward transitioned set of states.

4. The method of claim 3, further comprising:
    if the forward transitioned set of states passes the first property of the circuit design, determining the circuit design to be formally verified for at least the first property of the circuit design.

5. The method of claim 1, wherein the determining does not consider transitioned states resulting from transitioning of states of the inductive set failing at least the first property of the circuit design.

6. The method of claim 5, wherein the determining considers only transitioned states resulting from transitioning of states of the inductive set passing at least the first property of the circuit design.

7. The method of claim 1, wherein the transitioning is not performed on states of the inductive set failing at least the first property of the circuit design.

8. The method of claim 7, wherein the transitioning is performed only on states of the inductive set passing at least the first property of the circuit design.

9. The method of claim 1, wherein, each time the transitioning and the determining are repeated, prior to transitioning, the inductive set includes transitioned states.

10. The method of claim 1, wherein, each time the transitioning and the determining are repeated, prior to transitioning, the inductive set includes transitioned states passing at least the first property of the circuit design.

11. The method of claim 1, wherein, each time the transitioning and the determining are repeated, prior to transitioning, the inductive set excludes transitioned states failing at least the first property of the circuit design.

12. A method of circuit verification, comprising:
(a) performing bounded verification on a circuit design for a number of transitions, the bounded verification corresponding to a limit for a number of transitions, wherein the limit is less than a total number of all reachable states;
(b) performing induction proof of a first property for the number of transitions, wherein the induction proof is performed by a process comprising the acts of:
transitioning by at least one step, in a backward direction, states of an inductive set of at least one or more states of the circuit design passing at least the first property of the circuit design, resulting in transitioned states;
determining if the transitioned states of the inductive set fail at least the first property of the circuit design;
repeating the transitioning and the determining, until at least, the determining results in the transitioned states of the inductive set failing at least the first property of the circuit design; and
(c) if the at least one property is not verified, then increasing the limit for the bounded verification and repeating from (a).

13. The method of claim 12, further comprising:
a first iteration of transitioning by at least one step, in the backward direction, states of a first iteration of an inductive set of at least one or more states failing at least the first property of the circuit design, resulting in a first iteration of transitioned states.

14. The method of claim 13, further comprising:
performing a first iteration of determining if the first iteration of transitioned states of the inductive set produce at least one state failing at least the first property of the circuit design.

15. The method of claim 14, wherein, after the first iteration of transitioning, prior to the transitioning, the inductive set includes the first iteration of transitioned states.

16. The method of claim 14, wherein, after the first iteration of transitioning, prior to the transitioning, the inductive set includes the first iteration of transitioned states passing at least the first property of the circuit design.

17. The method of claim 14, wherein, after the first iteration of transitioning, prior to the transitioning, the inductive set excludes the first iteration of transitioned states failing at least the first property of the circuit design.

18. The method of claim 12, wherein, at least after a first iteration of transitioning, the determining does not consider transitioned states resulting from transitioning of states of the inductive set failing at least the first property of the circuit design.

19. The method of claim 18, wherein, at least after the first iteration of transitioning, the determining considers only transitioned states resulting from transitioning of states of the inductive set passing at least the first property of the circuit design.

20. The method of claim 19, wherein, at least after the first iteration of transitioning, the transitioning is not performed on states of the inductive set failing at least the first property of the circuit design.

21. The method of claim 20, wherein, at least after the first iteration of transitioning, the transitioning is performed only on states of the inductive set passing at least the first property of the circuit design.

22. The method of claim 12, wherein, at least after a first iteration of transitioning, each time the transitioning is repeated, prior to the transitioning, the inductive set includes transitioned states.

23. The method of claim 12, wherein, at least after a first iteration of transitioning, each time the transitioning is repeated, prior to the transitioning, the inductive set includes transitioned states passing at least the first property of the circuit design.

24. The method of claim 12, wherein, at least after a first iteration of transitioning, each time the transitioning is repeated, prior to the transitioning, the inductive set excludes transitioned states failing at least the first property of the circuit design.

25. The method of claim 12, wherein, at least after a first iteration of transitioning, each time the transitioning is repeated, prior to the transitioning, the inductive set excludes transitioned states able to reach, in one forward transition, any state of the circuit design failing at least the first property.

26. The method of claim 12, wherein, at least after a first iteration of transitioning, each time the transitioning is repeated, prior to the transitioning, the inductive set includes transitioned states except for transitioned states able to reach, in one forward transition, any state of the circuit design failing at least the first property.

27. The method of claim 12, wherein, at least after a first iteration of transitioning, each time the transitioning is repeated, prior to the transitioning, the inductive set includes transitioned states passing at least the first property of the circuit design except for transitioned states able to reach, in one forward transition, any state of the circuit design failing at least the first property.

28. The method of claim 12, wherein, at least after a first iteration of transitioning, each time the transitioning is repeated, prior to the transitioning, the inductive set excludes transitioned states failing at least the first property of the circuit design and transitioned states able to reach, in one forward transition, any state of the circuit design failing at least the first property.

29. A method of circuit verification, comprising:
attempting bounded verification of one or more properties of a circuit design for at least a first predetermined number of transitions;
attempting induction proof of the one or more properties of the circuit design for at least the first number of transitions; and
determining if the one or more properties of the circuit design are verified, based at least on the bounded verification and the induction proof; and
if the bounded verification and the induction proof are insufficient to determine the one or more properties of the circuit design to be verified, increasing the first predetermined number of transitions, wherein the predetermined number is less than a total number of all reachable states.

30. The method of claim 29, further comprising:
repeating at least one of attempting bounded verification and attempting induction proof and
determining if the one or more properties of the circuit design are verified, based at least on repeating, with the increased first predetermined number of transitions, at least one of bounded verification and the induction proof.

* * * * *